United States Patent [19]
Knecht et al.

[11] Patent Number: 5,640,746
[45] Date of Patent: Jun. 24, 1997

[54] METHOD OF HERMETICALLY ENCAPSULATING A CRYSTAL OSCILLATOR USING A THERMOPLASTIC SHELL

[75] Inventors: Thomas A. Knecht, Algonquin; Steven L. Wille, Palatine, both of Ill.

[73] Assignee: Motorola, Inc., Schaumburg, Ill.

[21] Appl. No.: 515,413

[22] Filed: Aug. 15, 1995

[51] Int. Cl.$^6$ .................................................. H04R 17/00
[52] U.S. Cl. ........................ 29/25.35; 29/827; 29/841; 264/272.11; 174/52.4
[58] Field of Search ................................ 29/25.35, 827, 29/841; 257/672, 687; 437/209, 220, 219; 264/272.11, 272.13, 272.14; 174/52.2, 52.4

[56] References Cited

U.S. PATENT DOCUMENTS

| | | | |
|---|---|---|---|
| 3,909,838 | 9/1975 | Beyerlein | 257/672 |
| 4,803,544 | 2/1989 | Holzschuh et al. | 174/52.4 X |
| 4,829,403 | 5/1989 | Harding | 29/841 X |
| 4,859,632 | 8/1989 | Lumbard | 29/841 X |
| 5,122,858 | 6/1992 | Mahulikar et al. | 257/753 |
| 5,213,748 | 5/1993 | Biswas et al. | 264/272.13 X |
| 5,473,512 | 12/1995 | Degani et al. | 174/52.4 X |
| 5,477,008 | 12/1995 | Pasqualoni et al. | 29/841 X |

FOREIGN PATENT DOCUMENTS 363233539  9/1988  Japan ........................ 29/841

*Primary Examiner*—Peter Vo
*Assistant Examiner*—Khan Nguyen
*Attorney, Agent, or Firm*—Brian M. Mancini; Gary J. Cunningham

[57] ABSTRACT

A method of hermetically encapsulating a crystal oscillator using a thermoplastic shell. A first step (102) includes molding a thermoplastic shell defining a cavity around a periphery of oscillator locations on a lead frame. A second step (104) includes attaching oscillator components including a piezoelectric element, capacitors and an integrated circuit to the lead frame. A third step (106) includes dispensing an encapsulant within the cavity defined by the thermoplastic shell to encapsulate the oscillator components. A fourth step (108) includes curing the encapsulant. A last step (110) includes excising the oscillator from the lead frame and the leads are formed for mounting.

10 Claims, 3 Drawing Sheets

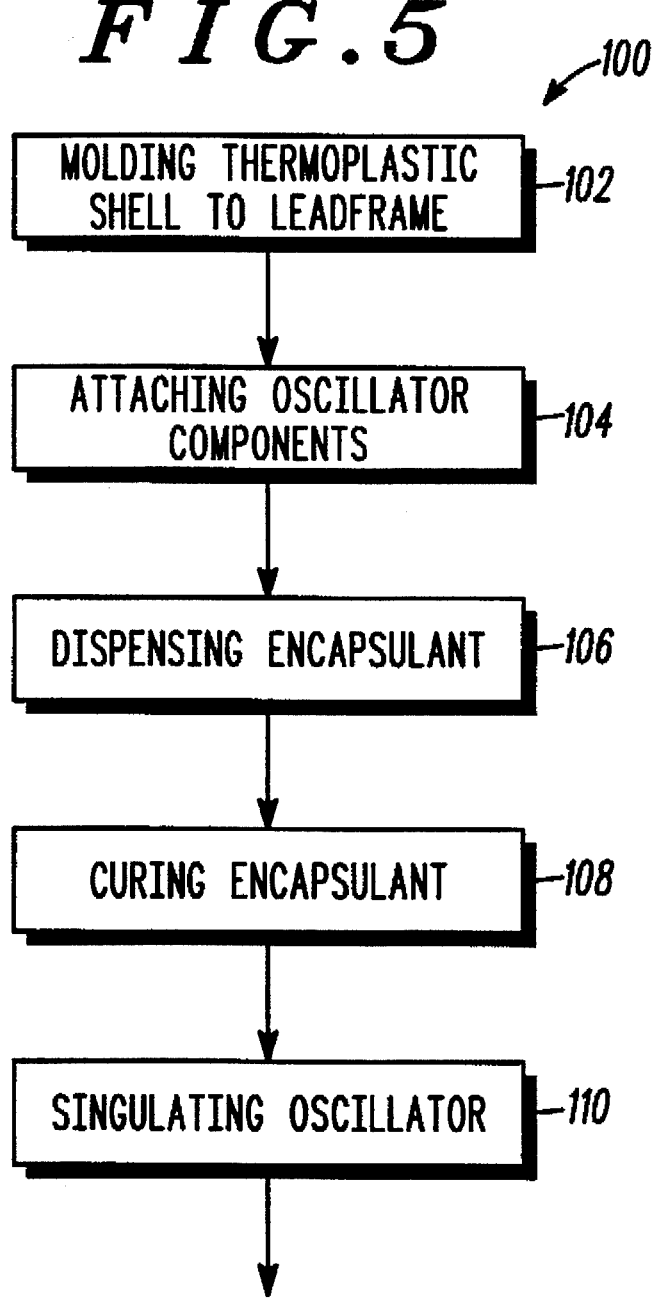

METHOD OF HERMETICALLY ENCAPSULATING A CRYSTAL OSCILLATOR USING A THERMOPLASTIC SHELL

FIELD OF THE INVENTION

The present invention relates generally to frequency control devices and, in particular, to a method of hermetically encapsulating a crystal oscillator using a thermoplastic shell.

BACKGROUND OF THE INVENTION

Frequency control devices are known to include various types of crystal oscillators. A typical quartz crystal oscillator utilizes several components including a piezoelectric element, an integrated circuit, capacitors, inductors, resistors, etc. These frequency control devices are commonly found in electronic communication devices such as, cellular phones, pagers, radios and wireless data devices. As consumer demand continually drives down the size and cost of this equipment, the need for oscillators to be smaller and less costly has become even greater.

The most sensitive component in a crystal oscillator is the piezoelectric element. Typically, this element is independently sealed in a hermetic package. The purpose of encapsulation is to passivate the integrated circuit (IC) die of the oscillator from the effects of the environment. This die is fragile and must be protected from excessive thermal and mechanical stresses and strains. Also, the die must be protected from exposure to chemicals including moisture, oxygen, acids, corrosives, etc. Previously, this passivation process had been accomplished by thermoset encapsulation techniques, ceramic packaging, or potting epoxies on printed circuit boards.

The most common method for passivation of an IC is thermoset plastic encapsulation by transfer molding. In this technique an IC is mounted and wire bonded to a conductive lead frame. Then the lead frame is suspended in a two piece mold cavity and a thermoset resin is slowly injected under high temperature and pressure to form a thermoset plastic which encapsulates the part. This is commonly referred to as transfer molding. This process is low cost, but it does have problems. Due to the temperatures and pressures used in this molding process, piezoelectric devices are thermally and mechanically stressed causing undesirable frequency shifts. Also, this method may cause occasional damage to the IC or its wirebonds. In addition, some thermoset resins can outgas chlorine and ammonia by-products which can corrode the metalization on the IC. Also, thermosets tend to be hydrophilic and may lose their effectiveness against moisture infiltration.

Alternatively, potting epoxies have been used in some applications to directly encapsulate IC dies on various substrates. Potting techniques sometimes incorporate complicated structures and have microcracking problems due to the differences in thermal expansion coefficients of the materials used. However, this technique is of a lower cost than ceramic packaging. Some prior art potting techniques have utilized a dam and an underlayment to contain a potting compound over a lead frame. However, there are some problems with this approach. First, an additional B-stage epoxy process is needed to provide a moisture barrier between the leads and the dam. Second, the use of a deposited, preformed or machined dam increases the cost of the product. Third, more packaging components are used. The present invention can solve many of these problems by the use of a pre-molded thermoplastic shell to contain an encapsulant.

In ceramic packaging techniques, the IC die is first mounted to a ceramic substrate and this ceramic substrate is placed within a hermetic package. This hermetic package may take the form of a welded metal can with glass-filled feedthroughs for the external electrical connections, or it may take the form of a single or multi-layered ceramic substrate that is sealed to a single or multi-layered ceramic lid by means of an epoxy or glass frit. Alternatively, the ceramic substrate may be sealed with a brazed or welded steel alloy lid. Although the above technique has been successful, these packages are structurally complex and relatively expensive.

A significant portion of the cost of a quartz crystal oscillator is in its packaging. These oscillators typically have higher material and labor costs than a similarly packaged IC. Therefore, oscillator scrap costs due to yield losses are to be avoided if at all possible. Previously, the packaging used for crystal oscillator devices was typically ceramic packaging. This packaging has demonstrated good yields and therefore low incurred scrap costs. However, the ceramic structures themselves, though relatively effective, are complicated and have a higher inherent cost. Cost reduction can be achieved if the packaging for these oscillators can be simplified without sacrificing yield.

There is a need for an improved encapsulation process for making crystal oscillators that is: (i) low cost and high yield; (ii) minimizes the number of process steps and separate packaging components; (iii) does not require external machining of sealing components; (iv) is robust under environmental testing; (v) minimizes problems from differing thermal expansion coefficients of package materials; (vi) reduces the migration of moisture or oxygen into the package; and (vii) is readily manufacturable without custom equipment or added costs.

BRIEF DESCRIPTION OF THE DRAWINGS

FIG. 5 shows a block diagram for a method of encapsulating a crystal oscillator, in accordance with the present invention.

DETAILED DESCRIPTION OF THE PREFERRED EMBODIMENT

Figure 1:
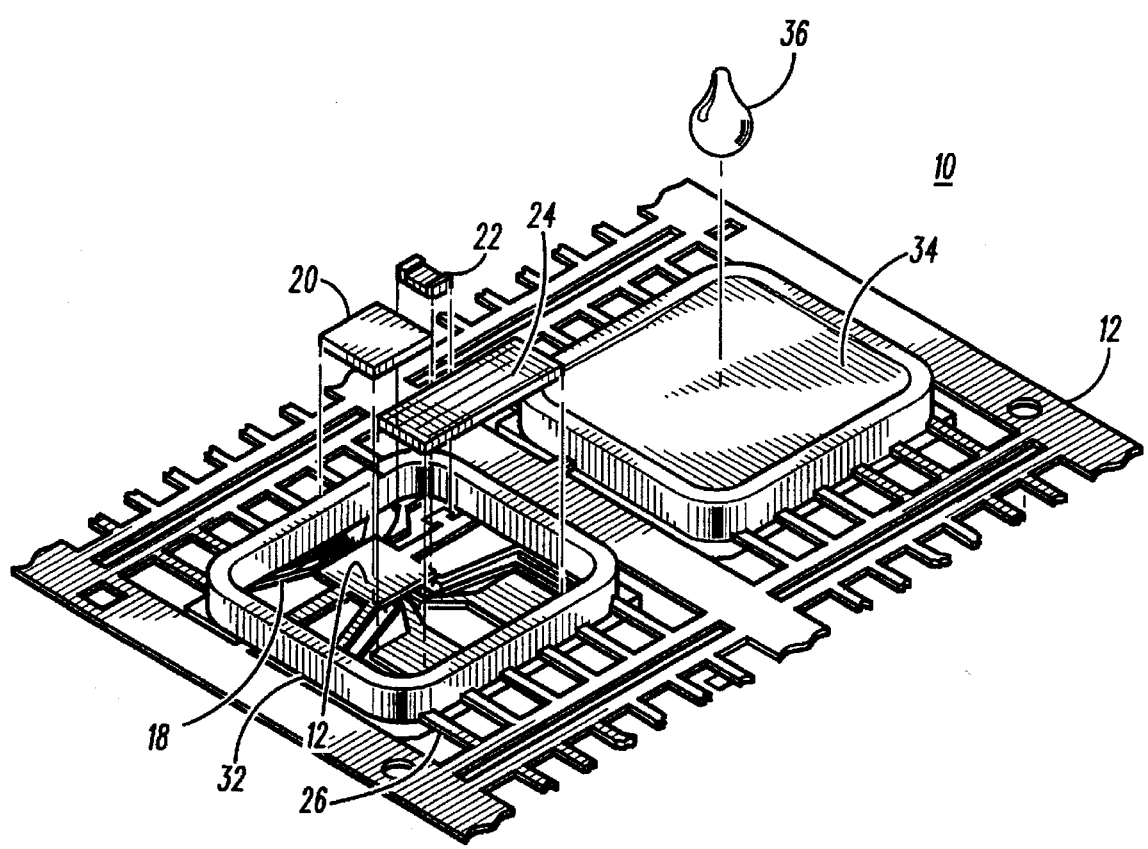
FIG. 1 shows a perspective view of a partially and fully processed crystal oscillator, in accordance with the present invention.

The present invention provides an improved method for the encapsulation of a crystal oscillator 10 and similar frequency control devices that utilize an integrated circuit (IC) die. In FIG. 1, a partially and fully processed crystal oscillator 10 is shown.

As shown in FIG. 1, the crystal oscillator 10 includes a lead frame 12 with a pre-molded shell 32, an IC 20, a capacitor 22, a piezoelectric element 24, and an encapsulant 34. More particularly, an interlayer 14 may be included to improve hermeticity between the shell 32 and the lead frame 12. The present invention advantageously provides a hermetic crystal oscillator 10 package using thermoplastics, whereas in prior art schemes hermeticity could only be accomplished reliably using a ceramic or thermoset, typically.

The lead frame 12 can be punched or etched from a metal sheet. In a preferred embodiment, the lead frame 12 is punched from a copper alloy sheet in an array form, substantially as shown in FIG. 1, for example. The advantage of an array arrangement is that automation and parallel processing may be used to increase factory production throughput.

The lead frame 12 is punched or etched so as to provide a plurality of leads 26 connecting to and extending from the lead frame 12 into each package and terminating with a wirebond pad 18. The wirebond pads 18 are adjacent to an IC die bond pad 16 which facilitates wire bonding of the IC 20 to the leads 26. The IC 20, capacitor 22 and piezoelectric element 24 are electrically connected to the lead frame 12 as well.

The lead frame 12 is preprocessed with a molded shell 32 of predetermined material surrounding a periphery of oscillator locations on a lead frame 12 so as to substantially surround and seal each lead 26 of the lead frame 12. The predetermined material of the shell 32 is preferably a polymer such as a thermoset plastic or thermoplastic. In a preferred embodiment, the shell 32 is a thermoplastic such as PPS (polyphenylenesulfide, manufactured by Phillips Petroleum Co. of Bartlesville, Okla.). However, a variety of thermoplastics and thermoplastic vendors known in the art may be used as well. The advantage of using a thermoplastic is that it can be injection molded much more quickly than typical thermoset resins, which can result in reduced costs.

In addition, before molding the lead frame 12 with the thermoplastic shell 32, the lead frame may be selectively thinly coated with a polymer such as an epoxy, acrylic, polyester, polysulfide, polyimide, and polyurethane to form an interlayer 14. Preferably, a fluoropolymer such as PVDF (polyvinylidene fluoride) which is available as Fluoroceram™ (manufactured by Morton International of Chicago, Ill.) is used to form the interlayer 14 on the portions of the lead frame 12 where the thermoplastic would surround the lead frame 12. A thermoplastic shell 32 subsequently molded around the lead frame 12 substantially does not contact the lead frame 12, but is substantially separated from it by the interlayer 14. The advantages of having the interlayer 14 are many. The properties of the interlayer 14 reduce chemical and water vapor infiltration at the thermoplastic/lead frame 12 interface due to improved adhesion provided by the interlayer 14. In addition, the interlayer 14 is resistant to high temperature, such as that produced by soldering, so that the interlayer 14 remains hermetic.

The encapsulant 34 comprises a material that can be viscously dispensed in uncured form (shown as item 36 in FIG. 1) to the lead frame 12 and within a cavity of the shell 32 so as to substantially cover the oscillator components 20, 22, 24 and substantially surround and further seal each individual lead 26.

In a preferred embodiment, the encapsulant 34 is a non-conductive and low viscosity potting material, such as an epoxy, such as Dexter Hysol FP4450™ (manufactured by the Hysol Division of Dexter Corp. of Industry, California). However, a variety of equivalent or similar phenolformaldehyde based epoxies known in the art may be used in this application. The encapsulant 34 should have certain thixotropic properties which allow the material to freely flow to fill the cavity defined by the thermoplastic shell 32, while being substantially free from forming air bubbles. The formation of air bubbles could cause microcracks during solder reflow of the oscillator package 10, which may lead to premature environmental failure and leakage.

Referring to FIGS. 1 and 5, a first major step can include a molding step 102 of molding a predetermined material around a lead frame 12 to form a shell 32 with a cavity and to substantially seal a plurality of leads 26 connected to the lead frame 12. In a preferred embodiment the material is chosen to be thermoplastic, and the preferred method of molding the thermoplastic is injection molding. The technique of injection molding is well known in the art and is an efficient, low cost technique.

Typically, the injection molding of the thermoplastic takes about ten seconds at a temperature of about 170° C. with no post curing required. Although these conditions are much less severe than typical thermoset resin molding (about six minutes at a temperature of about 170° C. and an extreme pressure of about 2000 pounds per square inch with a post cure time of about five hours), these less severe conditions can still contribute detrimental stresses which may cause frequency shifts in the piezoelectric element 24 of the crystal oscillator. Therefore, the molding process 102, is advantageously completed before the assembly of the piezoelectric element 24 to the lead frame 12. Additionally, since this process 102 occurs before oscillator is assembled, a thermoplastic may advantageously be used over a thermoset because of the easier, faster and lower cost processing techniques available for thermoplastics. Thermoplastics are not typically thought of in the art for encapsulation because their low glass transition temperatures may lead to melting during soldering. However, this process 102 has the advantage of using the beneficial processing and cost aspects of PPS along with the additional hermetic sealing properties of a separate encapsulant 34. In the event that the thermoplastic shell 32 becomes non-hermetic the encapsulant will preserve the hermeticity of the crystal oscillator 10. In this way, the thermoplastic shell 32 may be considered sacrificial.

In a preferred embodiment, the lead frame 12 has been suitably configured, such as by being previously punched from a copper alloy sheet in an array form. The advantage of an array configuration or arrangement is that automation and parallel processing may be used to increase factory production throughput. Also, in a preferred embodiment, the lead frame 12 can be selectively plated, before or after processing, to minimize corrosion, improve wirebonding inside the package and improve solderability outside the package. The lead frame 12 may be plated with a precious metal, preferably such as silver, on the wire bond pads 18, in proximity to and around where the IC 20 is placed, to improve wirebonding. In addition, this embodiment includes the leads 26 being tin (lead-tin) plated after processing the crystal oscillator 10 to improve solderability.

In addition, before injection molding the thermoplastic shell 32 around the lead frame 12, the lead frame 12 may be selectively thinly coated with a polymer such as an epoxy, acrylic, polyester, polysulfide, polyimide, and polyurethane to form an interlayer 14. Preferably, a fluoropolymer such as PVDF (polyvinylidene fluoride) which is available as Fluoroceram™ (manufactured by Morton International of Chicago, Ill.) is used to form the interlayer 14 on the portions of the lead frame 12 where the thermoplastic shell 32 would surround the lead frame 12. The Fluoroceram™ is supplied as a viscous fluid and may be applied by any suitable method known in the art. In a preferred embodiment, the Fluoroceram™ is applied by a roll coating technique which is commonly known in the art. The coating is then cured at about 260° C. for about 2 minutes. A thermoplastic shell 32 subsequently molded around the lead frame 12 substantially does not contact the lead frame 12, but is substantially separated from it by the interlayer 14. The interlayer 14 has the advantage of being applied equally well by many available methods known in the art. Also, the interlayer 14 may be directly applied to the lead frame 12 without any mechanical or chemical pretreatment of the lead frame 12.

Figure 2:
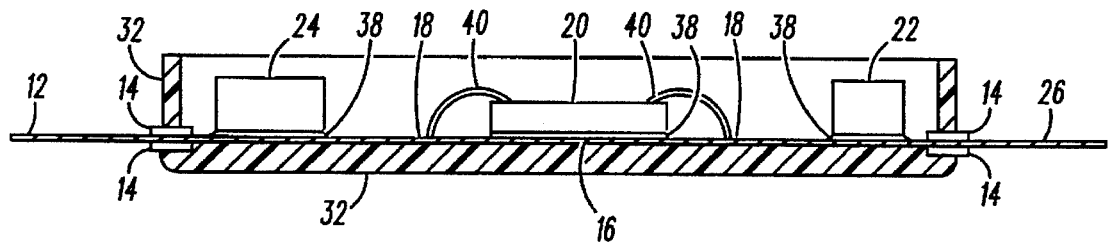
FIG. 2 shows a cross sectional view of an oscillator with an attached piezoelectric element, integrated circuit and components on a lead frame, and within a thermoplastic shell, in accordance with the present invention.

A second major step comprises an attachment step 104, which provides attaching oscillator components such as a piezoelectric element 24, at least one capacitor 22 and an IC 20 to the lead frame 12, substantially as shown in FIG. 2. These components may be attached by use of a conductive adhesive 38 selectively dispensed onto the top of the lead frame 12 in predetermined positions for the placement of the oscillator components such as the IC 20, capacitor 22 and piezoelectric element 24. In a preferred embodiment, the conductive adhesive 38 comprises a silver-filled epoxy, such as Amicon C990™ (manufactured by Grace Inc.). However, other suitable conductive epoxies may be used so long as they have the desired properties and characteristics. In a preferred embodiment, the conductive adhesive 38 is automatically dispensed by a Camalot System 5000 (manufactured by Camalot Systems, Inc. of Boston, Mass.) automatic dispensing system. However, a manual dispensing method may be used as well.

After the conductive adhesive 38 has been dispensed, the oscillator components, or IC 20, capacitor 22 and piezoelectric element 24 are aligned and placed onto the conductive adhesive 38, manually or automatically. In a preferred embodiment, the oscillator components including at least the IC 20, capacitor 22 and piezoelectric element 24 are automatically placed by a Seiko D-Tran XM robotic system (manufactured by Seiko Co. of Japan). After placing the oscillator components the conductive adhesive 38 is cured. The conductive adhesive 38 may be cured in a convection type, air vented oven (such as one manufactured by Blue-M Corp.) at a temperature of about 150° C. for a predetermined time, such as for about 60 minutes to about 90 minutes or until the conductive adhesive 38 is fully cured.

After curing the conductive adhesive 38, the IC 20 is connected to wirebond pads 18. The IC 20 may be connected by wirebonds 40, solder or conductive adhesive. In a preferred embodiment, the IC 20 is connected to the wirebond pads 18 with wirebonds 40. The wirebond 40 is typically gold or aluminum, and the wirebonding process may use either ball or wedge bonding. In a preferred embodiment, the IC 20 is ball bonded with a gold wirebond 40 of from about 0.5 to about 3 mils in diameter (typically a 1 to 1.5 mil diameter is used), for improved wire bonding. A preferred automated wirebonding system is a K&S 1419 wirebonder system (manufactured by Kulicke and Sofia, Inc. of Pennsylvania).

Figure 3:
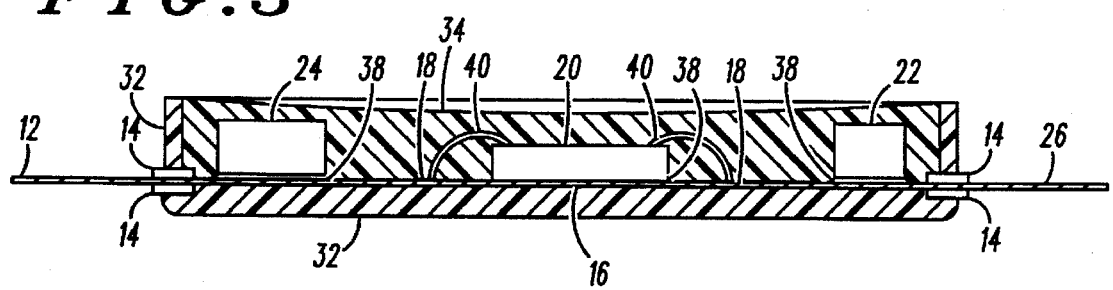
FIG. 3 shows a cross sectional view of the oscillator in FIG. 2 with an encapsulant in the thermoplastic shell, in accordance with the present invention.

A third major step includes a filling step 106. As shown in FIGS. 1 and 3, this step 106 provides dispensing an encapsulant 34 and 36 into a thermoplastic shell 32. This step 106 can begin with preheating the assembled lead frame 12 to a temperature of from about 65 to about 850 C. The encapsulant 34 may be of a material such as silicone or epoxy. In a preferred embodiment, the encapsulant 34 is a material such as Dexter Hysol FP4450™ (manufactured by the Hysol Division of Dexter Corp. of Industry, California) and is syringe dispensed, as item 36, through a needle heated to about 35° C. The encapsulant 34 is dispensed 36 into an interior cavity (reservoir) defined by the thermoplastic shell 32.

In one embodiment, the encapsulant 34 is dispensed in a spiral pattern over the oscillator components (IC 20, a capacitor 22 and a piezoelectric element 24) to provide a substantially uniform coating and to improve flow to avoid trapped voids or air bubbles. In a preferred embodiment, the encapsulant 34 material is chosen to have a viscosity adapted to substantially fill the interior cavity by gravity, whereby minimal voids or air bubbles are formed. The encapsulant 34 should be dispensed to substantially completely and uniformly fill the cavity formed by the thermoplastic shell 32 up to about a top of the thermoplastic shell 32. It is preferred that the encapsulant 34 not exceed the top of the thermoplastic shell 32. Also, it is preferred that the top surface of the encapsulant 34 be substantially flat so as to facilitate automatic marking, labeling, and handling by automated pick and place equipment.

The dispensing of the encapsulant 34, shown as item 36, has an advantage over typical thermoset resin transfer molding techniques in that the process is of a lower temperature and pressure than many known transfer molding techniques.

A fourth major process step is a curing step 108. This involves curing the encapsulant 34. In a preferred embodiment, the encapsulant 34 is cured in any suitable manner, such as in a convection type, air vented oven (such as one manufactured by Blue-M Corp.) at a temperature of about 125° C. for a period of about 30 minutes followed by a temperature of about 165° C. for a period of about 60 minutes until the encapsulant 34 is substantially fully cured. After the encapsulant 34 has been cured, the leads 26 and lead frame 12 may be electroplated with lead-tin to prevent corrosion and improve the solderability of the leads 26.

A final major process step is a singulating step 110. This step provides singulation (or separation) of the crystal oscillator 10 from the remaining unwanted portion of the lead frame 12. The crystal oscillator is excised from the lead frame by shearing the leads 26 near the inside periphery of the lead frame 12. A preferred device used for this singulating step 110 can be a punch tool such as one manufactured by a tool and die maker such as Dial Tool & Mfg. Corp. of Ill. In a preferred embodiment, the singulating step 110 is performed automatically. After singulation, the crystal oscillator 10 may be. electrically tested.

Figure 4:
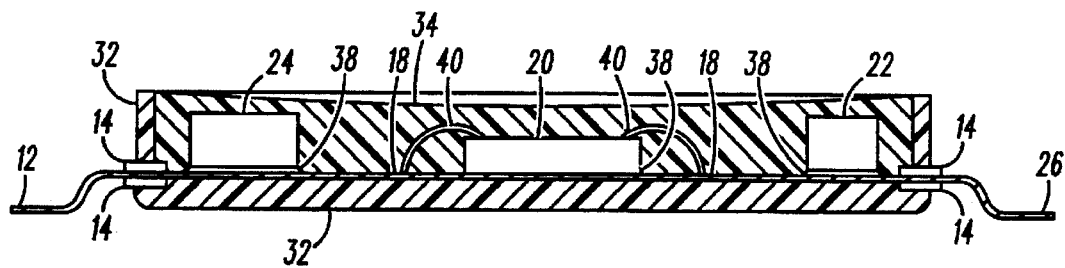
FIG. 4 shows a cross sectional view of the oscillator with the encapsulant cured, and after being excised from the lead frame and having the leads formed for mounting (gullwing version shown), in accordance with the present invention.

In a preferred embodiment, as shown in FIG. 4, the leads 26 are bent during or after the automatic excision of the crystal oscillator 10 from the lead frame 12 to make the crystal oscillator 10 surface mountable. The leads 26 may be formed into various shapes per surface mounting requirements. FIG. 4 shows an embodiment in the form of a gullwing lead shape. However, other lead shapes, such as butt-joint leads or J-shaped leads may be made.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A method of making a hermetically encapsulated surface mountable lead frame crystal oscillator, comprising:
   providing a lead frame having a plurality of cells having top surfaces and middle portions and a plurality of leads connecting to and extending from the lead frame into each cell;

plating a substantially middle portion of each cell with a precious metal such that an integrated circuit is wire bondable to the lead frame;

selectively coating the lead frame with a polymer interlayer;

molding a thermoplastic shell around the lead frame, such that the shell abuts the interlayer and substantially does not contact the lead frame, the shell defining a cavity substantially around a periphery of each cell;

attaching oscillator components to the top surface of the lead frame;

dispensing a predetermined viscous material having a predetermined viscosity adapted to substantially fill the cavity of the shell by gravity. whereupon during curing minimal, if any, voids are formed, to substantially fill the cavity of the shell;

curing the viscous material at a temperature of about 125° C. for a period of about 30 minutes followed by a temperature of about 165° C. for a period of about 60 minutes such that the oscillator components are hermetically sealed;

excising each cell from the lead frame to form a surface-mountable lead frame crystal oscillator; and adjusting each lead of the lead frame suitable for surface mounting.

2. The method of claim 1, wherein the adjusting step includes forming a plurality of at least one of gullwing leads, butt-joint leads and J-shaped leads.

3. The method of claim 1, wherein the attaching step includes:

selectively dispensing a conductive adhesive on the lead frame;

placing and aligning a piezoelectric element, at least one capacitor, and an IC on the conductive adhesive;

curing the adhesive; and wire bonding the IC to the lead frame.

4. The method of claim 13, wherein the polymer interlayer includes at least one member of the group consisting of epoxies, acrylics, polyesters, polysulfides, polyimides, polyurethanes and fluoropolymers.

5. The method of claim 4, wherein the polymer interlayer is selected to be fluoropolymer, and wherein the fluoropolymer is coated onto the lead frame and cured at about 260° C. for about 2 minutes.

6. The method of claim 1, wherein the adjusting step includes forming a plurality of at least one of gullwing leads, butt-joint leads and J-shaped leads.

7. The method of claim 1, wherein the dispensing step includes selecting the viscous material to include at least one member of the group consisting of silicone and epoxy.

8. A method of making a hermetically encapsulated surface mountable lead frame crystal oscillator, comprising:

providing a lead frame having a plurality of cells having top surfaces and middle portions and a plurality of leads connecting to and extending from the lead frame into each cell;

plating a substantially middle portion of each cell with a precious metal such that an integrated circuit is wire bondable to the lead frame;

selectively coating the lead frame with a fluoropolymer interlayer and curing the interlayer at about 260° C. for about 2 minutes, whereby the interlayer improves hermeticity between the lead frame and a thermoplastic shell;

molding a thermoplastic shell around the lead frame such that the shell abuts the interlayer but substantially does not contact the lead frame, the shell defining a cavity substantially around a periphery of each cell;

attaching oscillator components to the top surface of the lead frame;

dispensing an epoxy in a spiral pattern to substantially fill the cavity of the shell, the epoxy having a predetermined viscosity adapted to substantially fill the cavity by gravity, whereupon during curing minimal, if any, voids are formed;

curing the epoxy at a temperature of about 125° C. for a period of about 30 minutes followed by a temperature of about 165° C. for a period of about 60 minutes such that the oscillator components are hermetically sealed;

excising each cell from the lead frame to form a surface-mountable lead frame crystal oscillator; and adjusting each lead of the lead frame suitable for surface mounting.

9. The method of claim 8, wherein the bending step includes forming a plurality of at least one of gullwing leads, butt-joint leads and J-shaped leads.

10. The method of claim 8, wherein the attaching step includes:

selectively dispensing a conductive adhesive on the lead frame;

placing and aligning a piezoelectric element, at least one capacitor, and an IC on the conductive adhesive;

curing the adhesive; and wire bonding the IC to the lead frame.

* * * * *

UNITED STATES PATENT AND TRADEMARK OFFICE
CERTIFICATE OF CORRECTION

PATENT NO. : 5,640,746
DATED : June 24, 1997
INVENTOR(S) : Knecht et al.

It is certified that error appears in the above-indentified patent and that said Letters Patent is hereby corrected as shown below:

On the title page, "10 Claims" should read-- 9 Claims --.

<u>Claim 4, line 1</u>

Please replace "claim 13" with --claim 1--.

<u>Claim 6</u>

Please delete claim 6, as it is a duplicate of claim 2.

Signed and Sealed this

Thirtieth Day of December, 1997

Attest:

BRUCE LEHMAN

Attesting Officer

Commissioner of Patents and Trademarks